United States Patent [19]

Horvath et al.

[11] Patent Number: 4,540,922

[45] Date of Patent: Sep. 10, 1985

[54] MOTOR WINDING LEAKAGE MONITOR

[75] Inventors: Joseph G. Horvath, Astatula; James C. Miller, Tavares, both of Fla.

[73] Assignee: Automeg, Inc., Astatula, Fla.

[21] Appl. No.: 651,441

[22] Filed: Sep. 17, 1984

Related U.S. Application Data

[63] Continuation-in-part of Ser. No. 477,340, Mar. 21, 1983, abandoned.

[51] Int. Cl.³ .................. G01R 27/18; G08B 21/00
[52] U.S. Cl. .................. 318/490; 324/54; 340/647; 340/648
[58] Field of Search .............. 318/490; 324/51, 54; 340/647, 648

[56] References Cited

U.S. PATENT DOCUMENTS 3,746,979  7/1973  Kildishev et al. ........... 318/490 X
4,159,501  6/1979  White .................... 361/47

FOREIGN PATENT DOCUMENTS 57-14753   1/1982  Japan ................... 324/54
57-84370   5/1982  Japan ................... 340/647
57-161665 10/1982  Japan ................... 324/54
57-173765 10/1982  Japan ................... 324/54

Primary Examiner—William M. Shoop, Jr.
Assistant Examiner—Bentsu Ro
Attorney, Agent, or Firm—Macdonald J. Wiggins

[57] ABSTRACT

A low voltage power supply powers a high impedance, high voltage dc supply. An electronic switch serves to automatically connect the high voltage output to the windings of a motor when the motor is non-operating. A lead connects from the frame of the motor to a sense resistor connected to the high voltage system ground. A plurality of variable threshold comparators is connected across the sense resistor. Leakage of the motor windings insulation results in a current flow through the sense resistor producing a voltage drop proportional to the leakage. Each comparator is adjustable to produce an indication of a value of leakage resistance at which the comparator produces an output.

9 Claims, 2 Drawing Figures

MOTOR WINDING LEAKAGE MONITOR

This application is a continuation-in-part of Ser. No. 477,340 filed Mar. 21, 1983, now abandoned.

BACKGROUND OF THE INVENTION

1. Field of the Invention

The present invention relates to apparatus for measuring insulation leakage in motors and, more particularly, to apparatus for monitoring the windings of in-service electrical pump motors and the like for leakage and for producing on alarm when excessive leakage is indicated.

2. Description of the Prior Art

In electrical systems which utilize electric motors, the insulation of the motor windings can deteriorate, causing leakage of current to ground. High leakage currents can cause damage to the motor windings requiring replacement or rebuilding of the motors. In particular, systems utilizing submerged pump motors, such as lift stations, wells and other water systems, are particularly susceptible to insulation damage and leakage. In a submerged motor, it is common to utilize double shaft seals to prevent water or moisture from getting into and coming in contact with the motor windings. Under normal use, these seals may deteriorate permitting a resultant leakage of water. If the problem is caught in a timely fashion, the motor may be removed, disassembled and baked out to remove moisture which may have infiltrated the windings. The seals may be replaced, and the motor may be reassembled and placed back in service. The cos for such repairs is minimal compared to the cost if the deterioration were allowed to continue to the point of complete failure of the motor windings.

To forestall serious difficulties, a usual practice is to periodically test the insulation resistance from the windings to neutral or the ground connection to the motor frame. This is done with a megger, which may be a hand cranked magneto device that places several hundred volts between the winding and the motor frame and measures any leakage currents. If the leakage exceeds a predetermined value, it is an indication that there is an incipient seal failure. This manual approach to testing is time consuming where numerous pumps and motors are in use. In may instances, such testing may be done so infrequently that failure can occur before scheduled testing.

There is a need for apparatus which can provide continuous monitoring of leakage resistances in motors so that potential problems may be recognized long before serious damage is done. One approach to this need is disclosed in U.S. Pat No. 4,159,501 to White, which teaches the use of a high voltage direct current power source connected to an electrical motor to be monitored. The apparatus provides an output indication in response to a first leakage resistance and another indication responsive to a second leakage resistance, producing a signal warning in response to the second resistance value. In addition, an interrupter is provided to remove primary power from the load when leakage is detected. A disadvantage of the White apparatus is that the direct current high voltage supply, which may be 500 volts or so, is connected to the power line at all times even when the motor is in operation. Thus, not only will the leakage resistance of the motor to ground be measured, but also that of every other load, such as other motors and other electrical devices on the same circuit. In addition, the high voltage is added to the ac voltage present which will cause very large peaks of high voltage which can result in arcing and/or damaged insulation.

A monitoring device for motor winding insulation resistance is disclosed in Japanese laid-open application No. 57-84370, May 26, 1982, to Teraguchi. Teraguchi shows a field winding having a dc power supply connected to the motor, a leak detector, an indicator, and a switch, but has no means disclosed for automatically monitoring the leakage resistance. Teraguchi monitors the insulation resistance of a single motor during the operation of the machine.

Thus, there exists a need for a simple low cost insulation resistance monitor for motors and the like which will be automatically connected to the motor windings only when the motor is not in operation and which will give a positive indication when leakage resistance becomes excessive.

SUMMARY OF THE INVENTION

The present invention will be described with reference to a dual motor and pump system in which a pair of motors is monitored by a common unit. Assume that two three-phase motors are to be monitored with each being intermittently energized by a motor controller.

The invention includes a low voltage power supply, a high voltage power supply, a pair of electronic switches, and a set of comparators. The negative terminals of the low voltage and high voltage power supplies are connected to a common point, hereinafter referred to as the system ground. A voltage in the range of 500 to 800 volts is produced by the high voltage supply which is selectively connected to one phase of each motor on the motor side of the controller contacts. The pair of electronic switches provided serve to selectively connect the high voltage lead from the high voltage supply alternately to each of the motors in accordance with the following criteria.

It is desired to monitor the leakage resistance of each of the pair of motors only when one motor is operative and the motor to be tested is non-operative. In the event that both motors are operating or neither motor is operating, both electronic switches are to be opened. Control of the electronic switches is effected by connections to the motor controller windings. These connections provide means for sensing which motor is running and for controlling the electronic switches to connect the high voltage to the non-operative motor. When the switches sense that both motors are running or neither motor is running, the high voltage leads remain disconnected.

A lead is connected from the motor ground connection of the motors, represented by the motor frames, and is connected through a sensing resistor to the system ground, which floats with respect to the motor ground. If there is leakage between the motor windings and the motor frame, a dc leakage current produced by the high voltage monitoring signal will flow through the motor ground connection and the sensing resistor back to the high voltage supply producing a voltage drop thereacross proportional to the leakage.

In accordance with the invention, a plurality of comparator circuits is connected across the sensing resistor. In one embodiment of the invention, four comparator circuits are utilized. Each comparator circuit includes a variable reference voltage input which is adjusted in accordance with the value of leakage resistance to be indicated. For example, if it is desired to indicate when a leakage resistance of 10 megohms is found, the voltage produced across the sensing resistor due to a 10 megohm leakage is determined and applied to the comparator reference input. When such leakage voltage appears at the comparator input, the comparator will trigger and energize a visual signal which may be, for example, a light emitting diode (LED). Assume, for example, that indication of leakage resistances of 10 megohm, 5 megohm, and 1 megohm are desired and that an alarm is desired for a leakage resistance of less than 1 megohm. In such case, the voltages representative of these three values of leakage resistances are applied to the reference voltage inputs of three of the comparators which are connected to energize LEDs. One comparator would be adjusted to have a reference voltage slightly higher than the one megohm reference voltage and that comparator, when triggered, would close a relay. The relay may be utilized to sound an audible alarm or, in the case of a remote operation, may be connected to a telemetry system for producing a warning at a remote control center or the like. Thus, the invention permits gradual deterioration in a motor to be detected by occasional reference to the LED leakage resistance indicators and to provide an audible alarm or the like before severe damage has occurred.

Advantageously, the monitoring circuit is connected to the windings of a motor only when the motor is completely disconnected from the power lines and therefore, any leakage measured will be limited to the specific motor desired.

It is therefore a principal object of the invention to provide a leakage resistance monitoring system especially adapted for submerged pump motors and the like which will produce visual and audible alarms indicative of the magnitude of the leakage resistance.

It is another object of the invention to provide an electrical leakage resistance monitoring system which will be interconnected to the device to be monitored only when it is non-operational.

It is yet another object of the invention to provide an electrical leakage resistance monitoring system having electronic switches for selectively connecting and disconnecting a dc high voltage to the motor windings or other apparatus to be tested.

It is a further object of the invention to provide an electrical leakage monitoring system having a plurality of indicators which will indicate progressive deterioration in the insulation of electric motors.

It is still a further object of the invention to provide a leakage resistance monitoring system which will produce an audible alarm when the leakage resistance has decreased to an unacceptable value.

These and other objects and advantages of the invention will become apparent from the following detailed description and the drawings.

DETAILED DESCRIPTION OF THE PREFERRED EMBODIMENT

Figure 1:
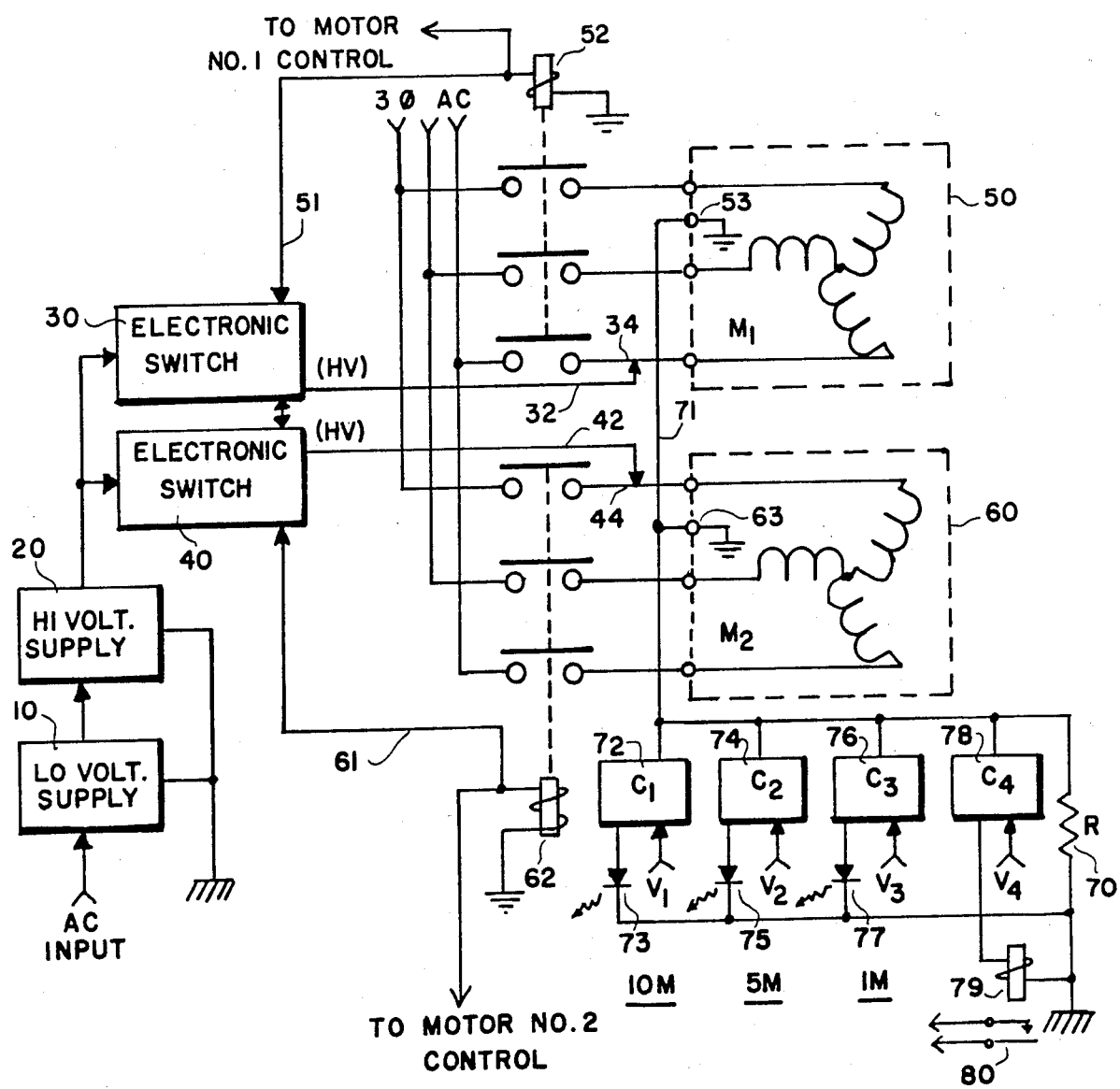
FIG. 1 shows a simplified block diagram of the invention as applied to a pair of motors which are intermittently operated.

Referring first to FIG. 1, a somewhat simplified block diagram of the leakage resistance monitoring system is shown. It is assumed that two three-phase motors 50, 60 are to be monitored for leakage resistance between the motor windings and the frames. Motor M1, designated as 50, has a frame ground connection 53; and motor M2, designated as 60, has a frame ground connection 63. Motor 50 is controlled by a three-phase contactor or controller 52 which, when the operating coil is energized, connects the three-phase winding to the three-phase ac source as shown. Similarly, controller 62 connects the windings of motor 60 to the three-phase power circuits. It is to be understood that controllers 52 and 62 are operated from the ac power line via a standard motor control relay system not shown in which ac voltage will appear on lead 61 when controller 62 is energized and on lead 51 when controller 52 is energized.

A low voltage power supply 10 is provided which produces the power for high voltage supply 20 and for a set of comparators 72, 74, 76 and 78. The negative lead of power supply 10 connects to the system ground which floats relative the frame grounds 53, 63. High voltage supply 20 is preferably an oscillator-type to be described in detail hereinafter which provides a high impedance, high voltage output which may be on the order of 500 to 800 volts. The high voltage output connects to electronic switch 30 and electronic switch 40 and the negative lead to the system ground. The output from electronic switch 30 is connected via lead 32 to motor winding lead 34 of motor 50. Output lead 42 from electronic switch 40 similarly connects to motor 60 winding lead 44. It is desired to close electronic switch 30 only under conditions that motor 50 is not running and motor 60 is running. Similarly, electronic switch 40 is to be closed when motor 60 is not operating and motor 50 is operating. Electronic switches 30 and 40 are both to be open when both motors are running or neither motor is running. To that end, the ac voltage present on either controllers 52 or 62—via leads 51 or 61, respectively, to electronic switches 30 and 40—is utilized to sense these conditions. As will be explained below, electronic switches 30 and 40 sense when either controller 52 or 62 is operated and control the application of high voltage to the motor windings accordingly.

A lead 71 is connected from motor frame ground connections 53 and 63 to sensing resistor R 70 which has its other end connected to the system ground. As may be noted, leakage between a motor winding and frame ground 53 or 63 will result, when high voltage is applied to such winding, in leakage current through resistor 70 and system ground back to high voltage supply 20, thus developing a voltage across resistor 70 proportional to the leakage resistance. Lead 71 also connects to the inputs of the four comparators, 72, 74, 76 and 78. The comparators are provided with respective reference voltages, $V_1$ through $V_4$. As will be understood, a leakage current flowing through resistor 70 will produce a voltage at each comparator input proportional to the leakage resistance producing the current flow. Therefore, each comparator for which such voltage produced is greater than its applied reference voltage will result in an output from such comparator. Comparators 72, 74 and 76 have as a load LED 73, 75 and 77, respectively.

Although the reference voltages for comparators 72, 74 and 76 may be selected appropriate to any desired leakage resistance, a preferred range may be as shown in FIG. 1. Comparator 72 is set for voltage $V_1$ which is selected equal to the voltage produced across sensing resistor 70 for a 10 megohm leakage resistance in a motor being tested. When the leakage resistance is greater than the selected threshold valve of 10 megohms, the voltage drop across resistor 70 will be less than $V_1$ and the output from comparator 72 will be low and will be dark. Any leakage resistance less than 10 megohms will produce a voltage greater than $V_1$ producing a HIGH at the output of comparator 72, illuminating LED 73. Similarly, voltage $V_2$ for comparator 74 may be set for a 5 megohm leakage resistance and voltage $V_3$ for comparator 76 may be set to indicate a resistance of 1 megohm. Each successive LED 75, 77 will light as the leakage resistance drops. Comparator 78 uses a reference voltage $V_4$ which is selected for the value of leakage resistance which is deemed low enough to require immediate attention. In the present example, $V_4$ would be set for a value of leakage resistance somewhat less than 1 megohm. When the voltage at the input of comparator 78 exceeds $V_4$, relay 79 connected to the output thereof closes contacts 80. Contacts 80 may operate an audible alarm for a local installation or it may be connected to a telemetry system for producing a remote alarm. It will be noted that all LEDs will be illuminated when the leakage resistance is less than required to operate relay 79.

Figure 2:
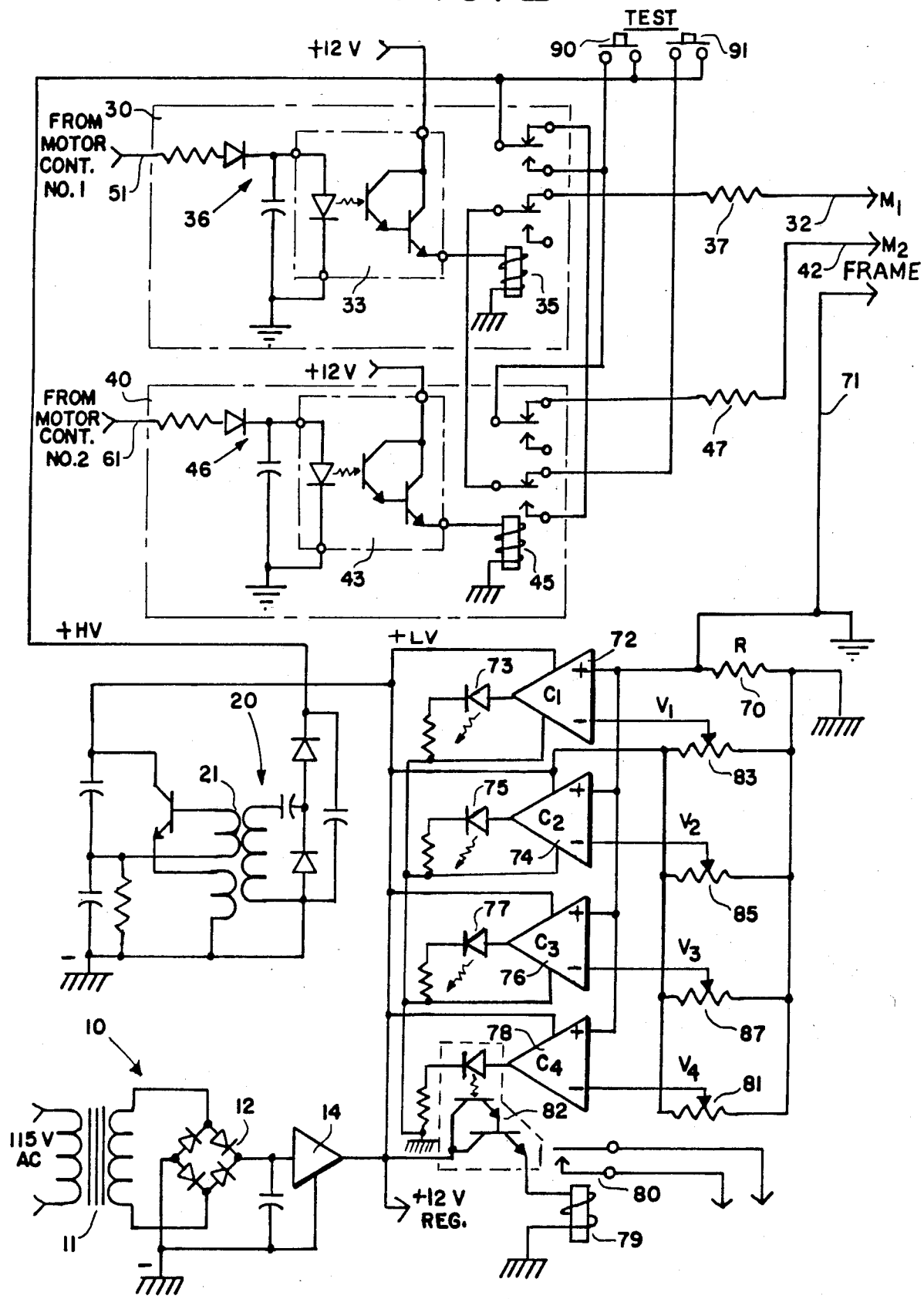
FIG. 2 is a detailed schematic diagram of the control circuits, comparator circuits and power supply circuits of the invention.

In FIG. 2, a schematic diagram of various elements of the invention are shown. Electronic switches 30 and 40 are similar, each having an opto-isolator, a control circuit and a relay. Using switch 30 for purposes of explanation, lead 51 from controller 52 of FIG. 1 will have 115 volts ac imposed thereon from the motor No. 1 control when that controller is energized. Rectifier circuit 36 produces a dc signal from this input which energizes opto-isolator 33, closing the circuit to relay 35.

In a similar fashion, when motor controller 62 of FIG. 1 is energized from motor control No. 2, the ac voltage appearing on lead 61 will result in closing of relay 45. As will be noted, a high voltage lead from high voltage power supply 20 connects to one contact of relay 35 with other contacts of that relay interconnected with the contacts of relay 45. Another contact of relay 35 is connected via limiting resistor 37 and lead 32 to one winding of motor 50 while a contact relay 45 is connected through limiting resistor 47 and lead 42 to one winding of motor 60. It is required that the high voltage be applied to motor 50 only when it is not running and there is no ac on lead 51 from motor controller 52, and while, at the same time, motor 60 is running. Thus, the interlocking of relays 35 and 45 will apply the high voltage on lead 32 only when relay 45 is operated and relay 35 is not operated, indicative of the required condition.

Similarly, the high voltage is to be applied by lead 42 to one winding of motor 60 only when motor 50 is operating and motor 60 is not. In this condition, relay 35 will be closed and relay 45 open. As can be seen, under this condition, the high voltage appears on lead 42. The motor ground leads from the frames of motors 50 and 60 are connected via lead 71 to sensing resistor 70 which connects back to the high voltage supply 20 system ground return. As will be clear, it is necessary that the monitoring system ground be isolated from the motor ground of the electrical motor system.

Comparators 72, 74, 76 and 78 may be conventional operational amplifiers as will be understood by those of skill in the art. The reference voltages $V_1$ through $V_4$ are adjustable by means of potentiometers 83, 85, 87 and 81, respectively. Calibration of the comparators may be most easily accomplished by connecting resistors of the selected threshold values desired between lead 32 and 71 and operating test button 90. The appropriate potentiometer 83, 85 or 87 is then adjusted to just obtain a HIGH output from the associated comparator. As may be noted, comparator 78 utilizes an opto-iosolator 82 to operate relay 79. Push buttons 90, 92 may be used for manual testing of motor 50 and 60 when neither motor is running.

Power supply 10 utilizes a conventional low voltage transformer 11, a bridge rectifier 12 and a voltage regulator 14 to produce 12 volts regulated power to the switching and comparator circuits. Power supply 10 also supplies power to high voltage supply 20 which is preferably an oscillator-type having oscillator transformer 21 with a high voltage secondary feeding a voltage doubler rectifier circuit. Generally, this type of high voltage circuit is desired for safety purposes since any attempt to draw excessive current from the supply will produce loading and cessation of oscillation.

It is anticipated that the leakage resistance monitoring system of the invention can be mounted integral with motor control panels such as are used with lift stations, pumping stations and the like. Due to its simplicity and low cost, the system may be included with new construction or may be added to existing installations. The savings in repair costs for one failed motor would pay for the system costs many times over.

While the invention has been disclosed herein with reference to a three-phase floating system, it may be applied to single-phase and grounded systems by the use of a relay which isolates the motor windings during monitoring. Although the preferred embodiment is a motor winding leakage testing system, the invention is equally applicable to other electrical devices and systems. While various devices have been recited in the preferred embodiment of the invention, it will be obvious to those of skill in the art to make modifications and changes in circuits shown without departing from the spirt and scope of the invention.

We claim:

1. Apparatus for automatically monitoring the insulation leakage resistance of two or more electric motors, each of said motors controlled by a respective contactor, comprising:

a high-voltage direct current power supply having a system ground and a high-voltage output;

switching means connected between said high-voltage output and electrical winding of each of said motors, said switching means having control means connected to the contactor of each of said motors, said control means responsive to the state of said contactor for controlling said switching means to apply said high-voltage output to the motor windings of a non-operated one of said motors only when at least one other of said motors is operating;

a sense resistor connected from the frames of said motors to said system ground; and comparator means connected across said sense resistor for producing an indication when a voltage across said resistor due to flow of leakage current exceeds a preselected value.

2. The apparatus as defined in claim 1 in which said comparator means includes an adjustable threshold voltage for adjusting said comparator means to produce an indication when a preselected voltage occurs across said resistor representative of a selected insulation leakage resistance value.

3. The apparatus as defined in claim 1 in which said comparator means includes a plurality of comparators, each of said comparatord having an adjustable threshold whereby each comparator is adjustable to produce an indication for a different value of insulation leakage resistance.

4. The apparatus as defined in claim 3 in which at least one of said comparators includes a light emitting diode for providing said indication.

5. The apparatus as defined in claim 1 in which:
each of said contactors includes an operating coil having an ac voltage applied thereto only when said contactor is operated, said switching means including a connection to said contactor coil and a rectifier circuit for producing a dc voltage when said contactor coil is energized;
an opto-isolator connected to said rectifier circuit, the output of said opto-isolator being energized only when said rectified dc voltage is present;
relay means operatively connected to the output of said opto-isolator, said relay operated therefrom, said relay having contacts connected with said high voltage power supply and said electrical windings such that high voltage is connected only to non-operating motors.

6. The apparatus as defined in claim 5 in which said apparatus is adapted to monitor the insulation leakage resistance for two motors and in which:
said switching means includes a first opto-isolator having its control input connected to the contactor coil of a first of said motors and a second opto-isolator having its control input connected to the contactor coil of the second of said motors;
a first relay connected to the output of said first opto-isolator and a second relay connected to the output of said second opto-isolator;
first relay contacts associated with said first relay and second relay contacts associated with said second relay, said first and second contacts interconnected and connected between said high voltage power supply and the electrical windings of said first and second motors such that said high voltage output is connected to the windings of said second motor only when said first relay is operated, said high voltage output is connected to the windings of said first motor only when said second relay is operated, and no high voltage is connected to said first or said second motor windings when both of said first and said second relays are operated or when both of said first and said second relays are non-operated.

7. A device for monitoring the leakage resistance of an electric motor or the like only when the motor is non-operated, said motor having a control switch, comprising:
a high voltage direct current power supply having a system ground and a high voltage output;
a sense resistor connected from the motor frame to said system ground;
electronic switch means connected between said high voltage output and the windings of said motor, said switch means having a control input connected to said control switch for causing closure of said electronic switch means when said control switch is open and for causing opening of said electronic switch means when said control switch is closed; and
a comparator connected to said sense resistor for producing an output indication of leakage current flowing through said sense resistor when such current exceeds a preselected magnitude.

8. The device as defined in claim 7 in which said comparator means includes adjustment means for setting a threshold representative of a preselected magniture of leakage current through said sense resistor.

9. The device as defined in claim 7 in which:
said electronic switch means includes an opto-isolator having its control input connected to said control switch; and
a relay connected to said opto-isolator, said relay having contacts which connect said high voltage to said windings only when said relay is non-operated, said opto-isolator causing said relay to operate when said control switch is closed.

* * * * *